United States Patent
Ichikawa

(10) Patent No.: US 10,836,157 B2
(45) Date of Patent: Nov. 17, 2020

(54) LIQUID DISCHARGE HEAD AND PRINTER

(71) Applicant: TOSHIBA TEC KABUSHIKI KAISHA, Tokyo (JP)

(72) Inventor: Masaya Ichikawa, Tagata Shizuoka (JP)

(73) Assignee: TOSHIBA TEC KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/575,776

(22) Filed: Sep. 19, 2019

(65) Prior Publication Data
US 2020/0101722 A1    Apr. 2, 2020

(30) Foreign Application Priority Data
Oct. 2, 2018  (JP) .................. 2018-187410

(51) Int. Cl.
  *B41J 2/045*  (2006.01)
  *H01L 41/08*  (2006.01)
  *B41J 2/14*   (2006.01)

(52) U.S. Cl.
  CPC ....... *B41J 2/04525* (2013.01); *B41J 2/14233* (2013.01); *H01L 41/0805* (2013.01); *B41J 2002/14258* (2013.01); *B41J 2002/14266* (2013.01); *B41J 2002/14491* (2013.01)

(58) Field of Classification Search
  CPC ..... B41J 2/04525; B41J 2/14233; H01J 2/055
  See application file for complete search history.

(56) References Cited

U.S. PATENT DOCUMENTS

2011/0315228 A1* 12/2011 Yokota .................. B01F 5/0644
                                                        137/1
2017/0001440 A1*  1/2017 Maeno ................. B41J 2/14201

FOREIGN PATENT DOCUMENTS

JP          6149863 B2    6/2017

* cited by examiner

*Primary Examiner* — Lamson D Nguyen
(74) *Attorney, Agent, or Firm* — Kim & Stewart LLP

(57) ABSTRACT

A liquid discharge head includes first and second actuators and a drive circuit. Each of the first and second actuators is configured to expand and contract first and second pressure chambers, respectively. The drive circuit is configured to, during a dot formation cycle apply a first number of discharge pulses to the first actuator to cause the first number of droplets to be discharged from the first pressure chamber and apply a second number of discharge pulses to the second actuator to cause the second number of droplets to be discharged from the second pressure chamber and apply a third number of precursors to the second actuator. The first number is greater than or equal to two. Each of the second and third numbers is greater than or equal to one. A sum of the second and third numbers is less than or equal to the first number.

20 Claims, 7 Drawing Sheets

LIQUID DISCHARGE HEAD AND PRINTER

CROSS-REFERENCE TO RELATED APPLICATION

This application is based upon and claims the benefit of priority from Japanese Patent Application No. 2018-187410, filed on Oct. 2, 2018, the entire contents of which are incorporated herein by reference.

FIELD

Embodiments described herein relate generally to a liquid discharge head and a printer.

BACKGROUND

Some liquid discharge heads such as ink jet heads discharge a plurality of droplets of liquid to form one dot on a medium. A liquid discharge head of one type can discharge any suitable number of droplets, from one to the maximum number, depending on the size of a dot to be formed.

In an ink jet head of the related art, there is a problem that a discharge rate varies depending on the number of droplets discharged to form one dot and thus the landing position of a droplet may vary depending on the size of a dot to be formed.

DETAILED DESCRIPTION

Embodiments provide a liquid discharge head and a printer in which variation in discharge rates based on the number of discharged droplets can be reduced.

In general, according to an embodiment, a liquid discharge head includes an array of actuators including first and second actuators and a drive circuit. Each actuator of the array is configured to expand and contract a pressure chamber corresponding thereto. The drive circuit is configured to, during a dot formation cycle apply a first number of discharge pulses to the first actuator to cause the first number of droplets to be discharged from a first pressure chamber corresponding to the first actuator, and apply a second number of discharge pulses to the second actuator to cause the second number of droplets to be discharged from a second pressure chamber corresponding to the second actuator and apply a third number of precursors to the second actuator. The first number is greater than or equal to two. Each of the second and third numbers is greater than or equal to one. A sum of the second and third numbers is less than or equal to the first number.

Hereinafter, a printer according to an embodiment will be described using the drawings.

A printer according to an embodiment forms an image on a medium such as paper using an ink jet head. The printer discharges ink in a pressure chamber provided in an ink jet head onto a medium to form an image on the medium. The printer is, for example, an office printer, a bar code printer, a POS printer, an industrial printer, a 3D printer, or the like. The medium on which the printer forms an image is not limited to a specific configuration. The ink jet head provided in the printer according to the embodiment is an example of a liquid discharge head, and the ink is an example of liquid.

Figure 1:
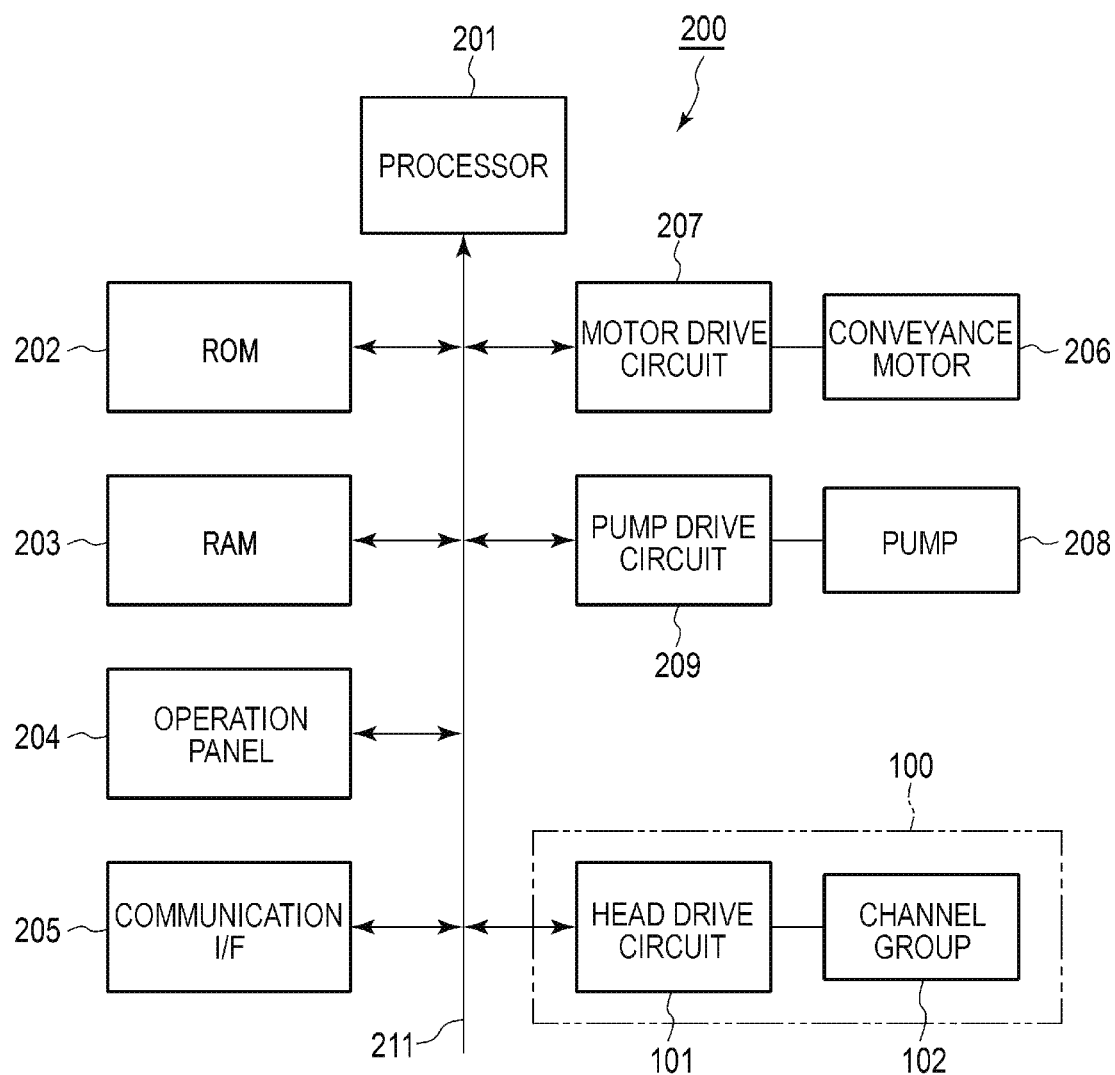
FIG. 1 is a block diagram illustrating an example of a configuration of a printer according to an embodiment.

FIG. 1 is a block diagram illustrating an example of a configuration of a printer 200.

As illustrated in FIG. 1, the printer 200 includes a processor 201, a ROM 202, a RAM 203, an operation panel 204, a communication interface 205, a conveyance motor 206, a motor drive circuit 207, a pump 208, a pump drive circuit 209, an ink jet head 100, and the like. The ink jet head 100 includes a head drive circuit 101, a channel group 102, and the like. The printer 200 also includes a bus line 211 such as an address bus or a data bus. The processor 201 is connected to the ROM 202, the RAM 203, the operation panel 204, the communication interface 205, the motor drive circuit 207, the pump drive circuit 209, and the head drive circuit 101 directly or through an input/output circuit via the bus line 211. In addition, the motor drive circuit 207 is connected to the conveyance motor 206. The pump drive circuit 209 is also connected to the pump 208.

The printer 200 may further include other elements as needed in addition to the above elements illustrated in FIG. 1, or a specific element may be excluded from the printer 200.

The processor 201 has a function of controlling the overall operation of the printer 200. The processor 201 may include an internal cache, various interfaces, and the like. The processor 201 implements various processes by executing a program stored in advance by the internal cache or the ROM 202. The processor 201 implements various functions as the printer 200 according to an operating system, an application program, and the like.

Some of the various functions implemented by executing a program by the processor 201 may be implemented by a hardware circuit. In this case, the processor 201 controls the function performed by the hardware circuit.

The ROM 202 is a non-volatile memory in which a control program and control data are stored in advance. The control program and control data stored in the ROM 202 are incorporated in advance according to the specifications of the printer 200. For example, the ROM 202 stores an operating system, an application program, and the like.

The RAM 203 is a volatile memory. The RAM 203 temporarily stores data and the like being processed by the processor 201. The RAM 203 stores various application programs and the like based on an instruction from the processor 201. In addition, the RAM 203 may store data required for executing the application program, an execution result of the application program, and the like. Further, the RAM 203 may function as an image memory in which print data is expanded.

The operation panel 204 is an interface that receives an input from an operator and displays various types of information to the operator. The operation panel 204 includes an operation unit that receives an input, and a display unit that displays information.

The operation panel 204 transmits a signal indicating an operation received from the operator to the processor 201 as the operation of the operation unit. For example, the operation unit includes function keys such as a power supply key, a paper feed key, and an error release key.

The operation panel 204 displays various types of information based on the control of the processor 201 as the operation of the display unit. For example, the operation panel 204 displays the status of the printer 200 and the like. For example, the display unit is configured of a liquid crystal monitor.

The operation unit may be configured as a touch panel. In this case, the display unit may be integrally formed with the touch panel as the operation unit.

The communication interface 205 is an interface for transmitting and receiving data to and from an external device via a network such as a local area network (LAN). For example, the communication interface 205 is an interface that supports LAN connection. For example, the communication interface 205 receives print data from the client terminal via the network. For example, when an error occurs in the printer 200, the communication interface 205 transmits a signal notifying the error to a client terminal.

The motor drive circuit 207 controls driving of the conveyance motor 206 according to the signal from the processor 201. For example, the motor drive circuit 207 transmits a power or control signal to the conveyance motor 206.

The conveyance motor 206 functions as a drive source of a conveyance mechanism that conveys a medium such as paper based on the control of the motor drive circuit 207. When the conveyance motor 206 is driven, the conveyance mechanism starts conveyance of the medium. The conveyance mechanism conveys the medium to the printing position by the ink jet head 100. The conveyance mechanism discharges a printed medium to the outside of the printer 200 from a discharge port (not illustrated).

The motor drive circuit 207 and the conveyance motor 206 make up a conveyance unit that conveys the medium.

The pump drive circuit 209 controls the drive of the pump 208. When the pump 208 is driven, ink is supplied from an ink tank to the ink jet head 100.

The ink jet head 100 discharges ink droplets to a medium based on print data. The ink jet head 100 includes a head drive circuit 101, a channel group 102, and the like.

Hereinafter, the ink jet head according to the embodiment will be described using the drawings. In the embodiment, the ink jet head 100 (refer to FIG. 2) of a share mode type is described. The ink jet head 100 will be described as an ink jet head that discharges ink onto paper. The medium on which the ink jet head 100 discharges ink is not limited to a specific configuration.

Figure 2:
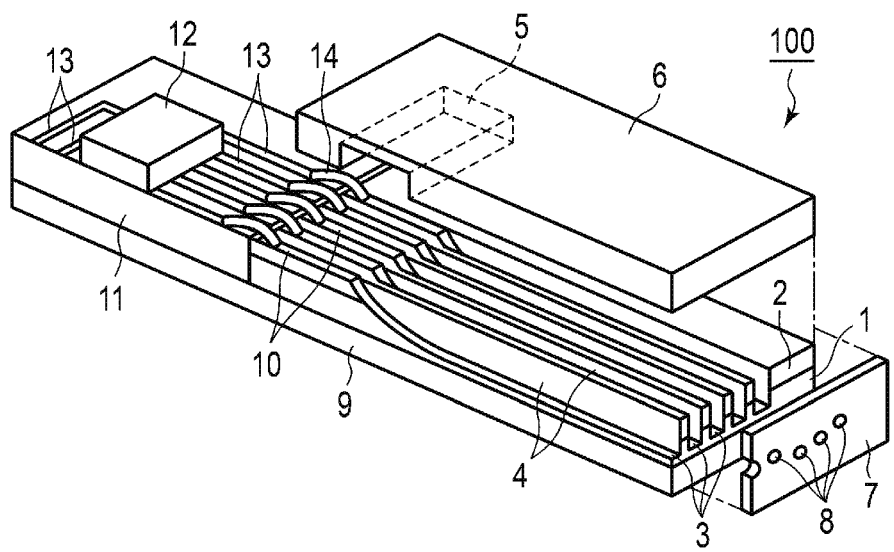
FIG. 2 illustrates a perspective view of an example of an ink jet head according to the embodiment.
Figure 3:
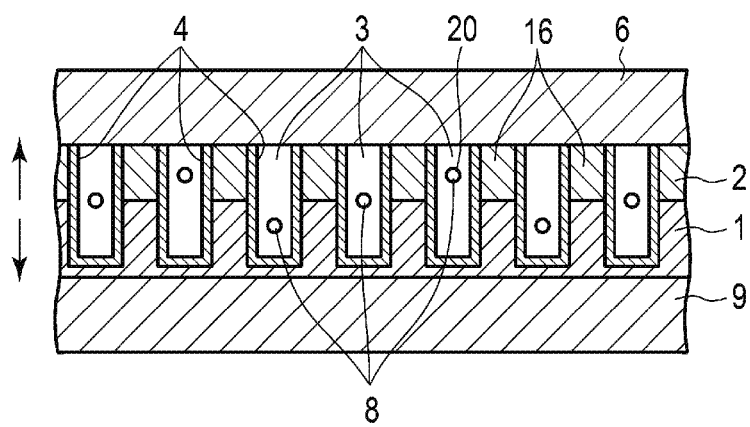
FIG. 3 illustrates a cross-sectional view of the ink jet head.
Figure 4:
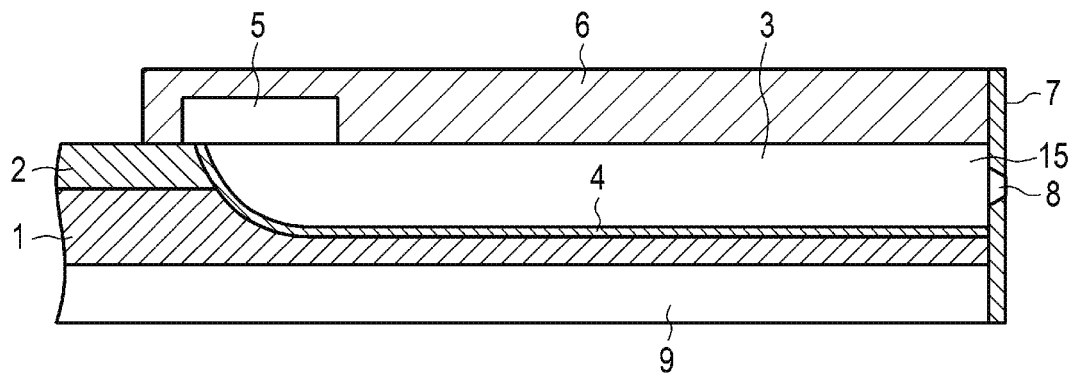
FIG. 4 illustrates a longitudinal cross-sectional view of the ink jet head.

Next, the example of the configuration of the ink jet head 100 will be described using FIGS. 2 to 4. FIG. 2 illustrates a perspective view of a part of the ink jet head 100 in an exploded manner. FIG. 3 illustrates a cross-sectional view of the ink jet head 100. FIG. 4 illustrates a longitudinal cross-sectional view of the ink jet head 100.

The ink jet head 100 has a base substrate 9. In the ink jet head 100, a first piezoelectric member 1 is joined with an upper surface of the base substrate 9, and a second piezoelectric member 2 is joined on the first piezoelectric member 1. The joined first piezoelectric member 1 and second piezoelectric member 2 are polarized in mutually opposite directions along the thickness direction, as illustrated by the arrows in FIG. 3.

The base substrate 9 is formed using a material having a small dielectric constant and a small difference in thermal expansion coefficient between the first piezoelectric member 1 and the second piezoelectric member 2. As the material of the base substrate 9, for example, alumina ($Al_2O_3$), silicon nitride ($Si_3N_4$), silicon carbide (SiC), aluminum nitride (AlN), lead zirconate titanate (PZT) or the like may be used. As the materials of the first piezoelectric member 1 and the second piezoelectric member 2, lead zirconate titanate (PZT), lithium niobate ($LiNbO_3$), lithium tantalate ($LiTaO_3$) or the like may be used.

The ink jet head 100 includes a number of long grooves 3 from a leading end side to a rear end side of the joined structure of the first piezoelectric member 1 and second piezoelectric member 2. Grooves 3 are spaced at constant intervals and are arranged in parallel. Each of the grooves 3 is open at the leading end and inclined upward at the rear end.

The ink jet head 100 includes electrodes 4 on the side walls and the bottom of each groove 3. The electrode 4 has a two-layer structure of nickel (Ni) and gold (Au). The electrodes 4 are uniformly deposited in the respective grooves 3 by plating, for example. The method of forming the electrode 4 is not limited to the plating method. Additionally, a sputtering method, a vapor deposition method or the like can also be used.

The ink jet head 100 includes a lead-out electrode 10 from the rear end of each groove 3 toward the rear upper surface of the second piezoelectric member 2. The lead-out electrode 10 extends from the electrode 4.

The ink jet head 100 includes a top plate 6 and an orifice plate 7. The top plate 6 closes the upper portion of each groove 3. The orifice plate 7 closes the leading end of each groove 3. In the ink jet head 100, a plurality of pressure chambers 15 are formed by the grooves 3, each of which is surrounded by the top plate 6 and the orifice plate 7. The pressure chamber 15 is filled with the ink supplied from the ink tank. The pressure chambers 15 have, for example, a shape with a depth of 300 μm and a width of 80 μm, and are arranged in parallel at a pitch of 169 μm. Such pressure chamber 15 is also referred to as an ink chamber.

The top plate 6 includes a common ink chamber 5 at the rear side inside the top plate. The orifice plate 7 includes nozzles 8 at positions facing the grooves 3. The nozzle 8 communicates with the facing groove 3, that is, the pressure chamber 15. The nozzle 8 has a shape tapered from the pressure chamber 15 side to the opposite ink discharge side. The nozzles 8 corresponding to three adjacent pressure chambers 15 is set as one set, and are formed to be shifted at constant intervals in the height direction of the grooves 3 (in the vertical direction in the drawing of FIG. 3).

When the pressure chamber 15 is filled with ink, a meniscus 20 of the ink is formed on the nozzle 8. The meniscus 20 is formed along the inner wall of the nozzle 8.

The first piezoelectric member 1 and the second piezoelectric member 2 that form partition walls of the pressure chambers 15 are sandwiched by the electrodes 4 provided in each of the pressure chambers 15 and form an array of actuators 16 for driving the pressure chambers 15.

In the ink jet head 100, a printed circuit board 11 on which a conductive pattern 13 is formed is joined to the upper surface on the rear side of the base substrate 9. In the ink jet head 100, a drive IC 12 in which a head driving circuit 101 described below is mounted on the printed circuit board 11 is mounted. The drive IC 12 is connected to the conductive pattern 13. The conductive pattern 13 is coupled to each lead-out electrode 10 with a conducting wire 14 by wire bonding.

A set of the pressure chamber 15, the electrode 4, and the nozzle 8 of the ink jet head 100 is referred to as a channel. That is, the ink jet head 100 has channels ch. 1, ch. 2, . . . , ch. N same as the number N of the grooves 3.

Next, the head drive circuit 101 will be described.

Figure 5:
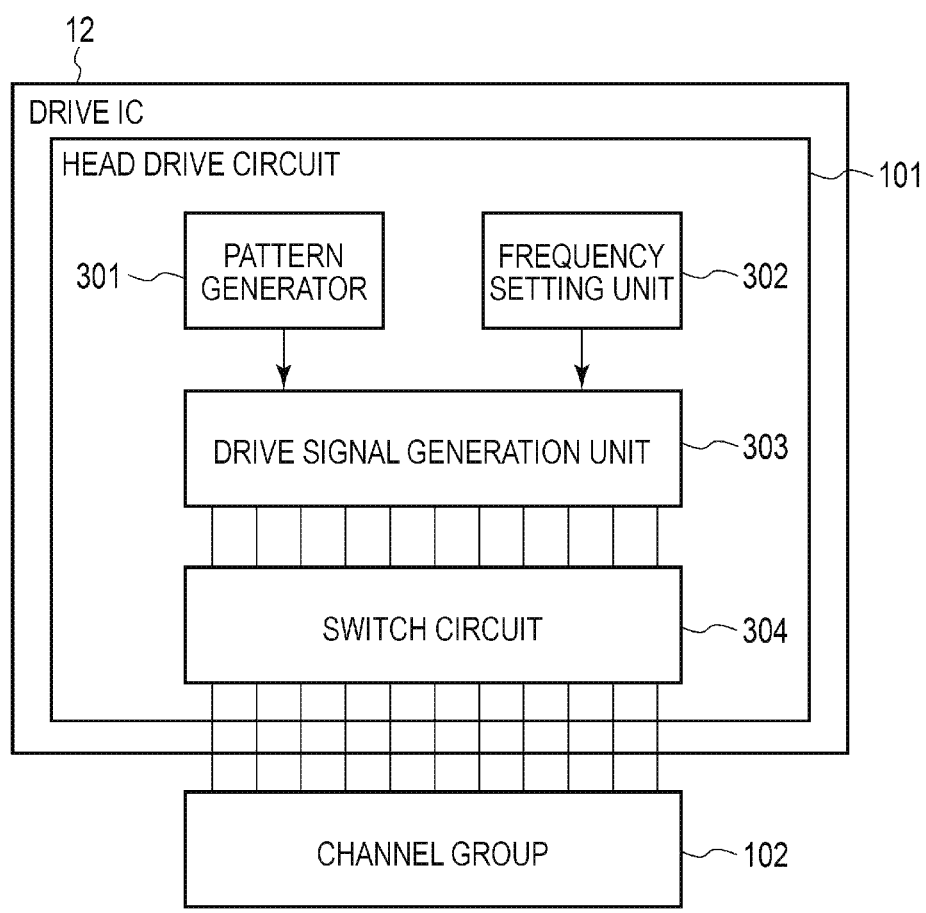
FIG. 5 is a block diagram illustrating an example of a configuration of a head drive circuit according to the embodiment.

FIG. 5 is a block diagram for explaining an example of the configuration of the head drive circuit 101. As described above, the head drive circuit 101 is arranged in the drive IC 12.

The head drive circuit 101 drives the channel group 102 of the ink jet head 100 based on print data.

The channel group 102 includes a plurality of channels (ch. 1, ch. 2, . . . , ch. N) including the pressure chamber 15, the electrode 4, the nozzle 8 and the like. That is, based on the control signal from the head drive circuit 101, the channel group 102 discharge ink by the operation of each pressure chamber 15 which is expanded or contracted by the corresponding actuator 16.

As illustrated in FIG. 5, the head drive circuit 101 includes a pattern generator 301, a frequency setting unit 302, a drive signal generation unit 303, a switch circuit 304, and the like.

The pattern generator 301 generates various waveform patterns using a waveform pattern of an expansion pulse for expanding the volume of the pressure chamber 15, a rest period for releasing the volume of the pressure chamber 15, and a waveform pattern of a contraction pulse for contracting the volume of the pressure chamber 15.

The pattern generator 301 generates a waveform pattern of a discharge pulse for discharging one ink droplet. A discharge pulse period is a time period for discharging one ink droplet, that is, a so-called 1 drop cycle.

The discharge pulse will be described later.

Also, the pattern generator 301 generates a pattern of a precursor that does not cause discharge of ink droplets.

The precursor will be described in detail later.

The frequency setting unit 302 sets the driving frequency of the ink jet head 100. The drive frequency is a frequency of drive pulses generated by the drive signal generation unit 303. The head drive circuit 101 is operated according to the drive pulses.

The drive signal generation unit 303 generates a pulse for each channel based on the waveform pattern generated by the pattern generator 301 and the drive frequency set by the frequency setting unit 302 according to the print data input from the bus line. The pulse for each channel is output from the drive signal generation unit 303 to the switch circuit 304.

The switch circuit 304 switches the voltage to be applied to the electrode 4 of each channel in accordance with the pulse for each channel output from the drive signal generation unit 303. That is, the switch circuit 304 applies a voltage to the actuator 16 of each channel based on the conduction time of the expansion pulse set by the pattern generator 301 or the like.

The switching circuit 304 expands or contracts the volume of the pressure chamber 15 of each channel by switching the voltage, and discharges ink droplets by the number of gradations from the nozzles 8 of each channel.

Next, an operation example of the ink jet head 100 configured as described above will be described with reference to FIGS. 6 to 8.

Figure 6:
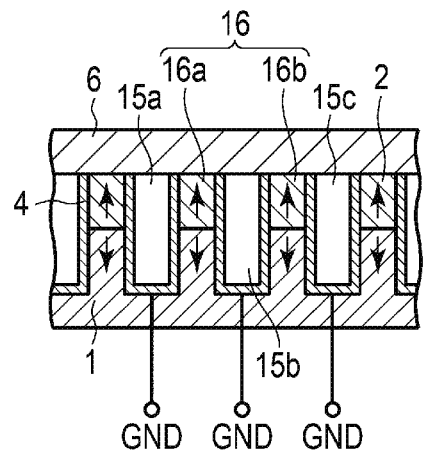
FIGS. 6-8 illustrate an operation example of the ink jet head.

FIG. 6 illustrates a state of the pressure chamber 15b in a rest period. As illustrated in FIG. 6, in the head drive circuit 101, all the potentials of the electrodes 4 respectively arranged on each of wall surfaces of a pressure chamber 15b and pressure chambers 15a and 15c adjacent to the pressure chamber 15b are set to the ground potential GND. In this state, a partition wall 16a sandwiched between the pressure chamber 15a and the pressure chamber 15b and a partition wall 16b sandwiched between the pressure chamber 15b and the pressure chamber 15c do not have distortion.

Figure 7:
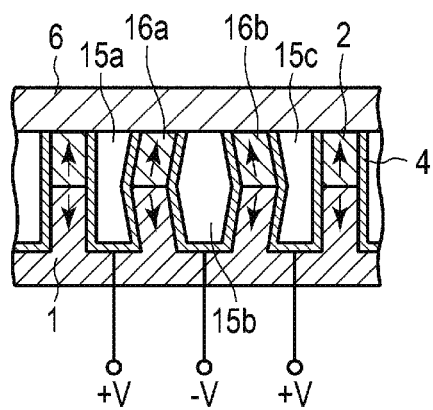

FIG. 7 illustrates an example of a state in which the head drive circuit 101 applies an expansion pulse to the actuator 16 corresponding to the pressure chamber 15b. As illustrated in FIG. 7, the head drive circuit 101 applies a negative voltage −V to the electrode 4 of the central pressure chamber 15b, and applies a positive voltage +V to the electrodes 4 of the pressure chambers 15a and 15c on both sides of the pressure chamber 15b. In this state, an electric field of 2 V is applied to each of the partition walls 16a and 16b in a direction orthogonal to the polarization direction of the first piezoelectric member 1 and the second piezoelectric member 2. By this action, each of the partition walls 16a and 16b is respectively deformed outward to expand the volume of the pressure chamber 15b.

Figure 8:
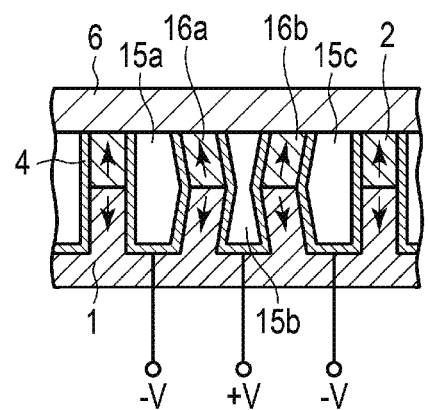

FIG. 8 illustrates an example in which the head drive circuit 101 applies a contraction pulse to the actuator 16 corresponding to the pressure chamber 15b. As illustrated in FIG. 8, the head drive circuit 101 applies a positive voltage +V to the electrode 4 of the central pressure chamber 15b, and applies a negative voltage −V to the electrodes 4 of the pressure chambers 15a and 15c on both sides. In this state, an electric field having a voltage of 2 V is applied to each of the partition walls 16a and 16b in a direction opposite to the direction in FIG. 7. By this action, each of the partition walls 16a and 16b is respectively deformed inward to contract the volume of the pressure chamber 15b.

When the volume of the pressure chamber 15b is expanded or contracted, pressure vibration occurs in the pressure chamber 15b. Due to this pressure vibration, the pressure in the pressure chamber 15b is increased, and an ink droplet is discharged from the nozzle 8 communicating with the pressure chamber 15b.

Thus, the partition walls 16a and 16b separating the respective pressure chambers 15a, 15b, and 15c form an actuator 16 for applying pressure vibration to the inside of the pressure chamber 15b having the partition walls 16a and 16b as wall surfaces. That is, the pressure chamber 15 is expanded or contracted by the operation of the actuator 16.

In addition, each pressure chamber 15 shares the actuator 16 with the adjacent pressure chamber 15 respectively. For this reason, the head drive circuit 101 cannot drive each pressure chamber 15 simultaneously. The head drive circuit 101 divides each pressure chamber 15 into (n+1) groups at intervals of n (n is an integer of 2 or more) and drives the pressure chambers. In the present embodiment, the head drive circuit 101 exemplifies a case of so-called three-division drive in which every two pressure chambers 15 are divided and driven into three groups. The three-division drive is merely an example and may be four-division drive or five-division drive.

Next, the pulses to be applied to the actuator 16 by the head drive circuit 101 will be described.

Figure 9:
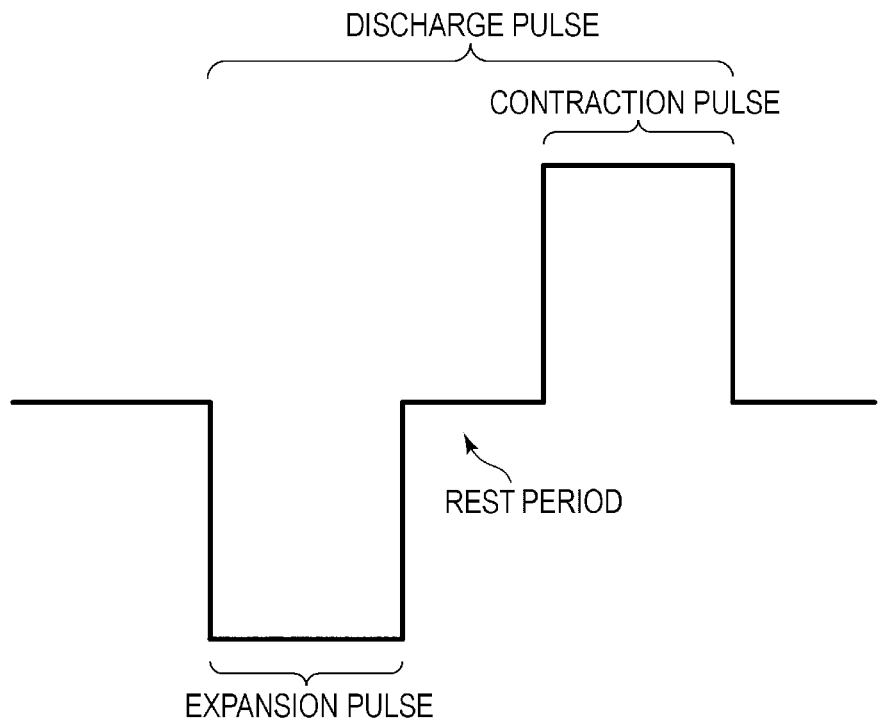
FIG. 9 illustrates an example of a discharge pulse applied to an actuator.

FIG. 9 illustrates an example of a discharge pulse. As illustrated in FIG. 9, the discharge pulse includes an expansion pulse of a predetermined time, a release time period of a predetermined time, and a contraction pulse of a predetermined time.

First, an expansion pulse is applied to the actuator 16. The expansion pulse expands the volume of the pressure chamber 15 formed by the actuator 16. That is, the expansion pulse brings the pressure chamber 15 into the state illustrated in FIG. 7. In this state, the pressure in the pressure chamber 15 is reduced, and the ink is supplied to the pressure chamber 15 from the common ink chamber 5. The expansion pulse is formed to have a predetermined length of time. That is, the expansion pulse expands the volume of the pressure chamber 15 for a predetermined period of time. For example, the width of the expansion pulse is about half (AL) of a natural vibration period of the pressure chamber 15.

After the expansion period, the pressure chamber 15 is released. That is, the pressure chamber 15 returns to the default state (the state of FIG. 6). The default state may be referred to as a neutral state. While the default state of the pressure chamber 15 is maintained, the pressure in the pressure chamber 15 rises. As the pressure in the pressure chamber 15 rises, the velocity of the meniscus 20 formed on the nozzle 8 exceeds the threshold at which the ink droplet is discharged. The ink droplet is discharged from the nozzle 8 of the pressure chamber 15 at the timing when the velocity of the meniscus 20 exceeds a discharge threshold.

When a predetermined time passes after the pressure chamber 15 is released, a contraction pulse is applied to the actuator 16. The contraction pulse reduces the volume of the pressure chamber 15 formed by the actuator 16. That is, the contraction pulse brings the pressure chamber 15 into the state illustrated in FIG. 8. The contraction pulse cancels out the pressure wave vibration in the pressure chamber after the ink droplet is discharged, so that the next discharge is not affected by the previous discharge.

Next, the precursor which is applied to the actuator 16 by the head drive circuit 101 will be described.

The precursor is a pulse that does not cause ink to be discharged from the pressure chamber 15. That is, the precursor is a pulse that does not cause ink to be discharged from the pressure chamber 15 but causes pressure vibration in the pressure chamber 15.

Figure 10:
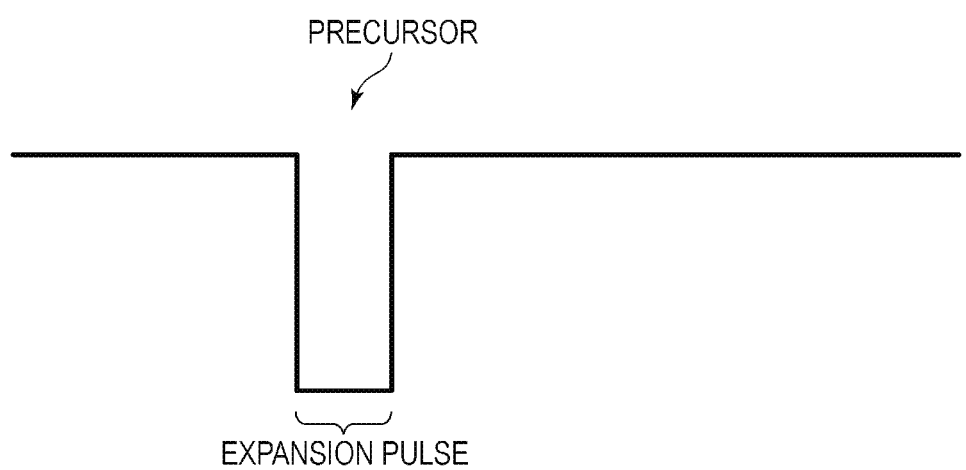
FIG. 10 illustrates an example of a precursor applied to the actuator.

FIG. 10 illustrates an example of the precursor. As illustrated in FIG. 10, the precursor may include an expansion pulse of a predetermined length of time. That is, the precursor may be an expansion pulse that expands the volume of the pressure chamber 15 formed by the actuator 16. The expansion pulse brings the pressure chamber 15 into the state illustrated in FIG. 7. In this state, the pressure in the pressure chamber 15 is decreased and pressure vibration occurs in the pressure chamber 15.

For example, the precursor may include an expansion pulse for a period of time shorter than that of the expansion pulse of the discharge pulse.

The head drive circuit 101 adjusts the pressure in the pressure chamber 15 by applying the precursor to stabilize the discharge rate of the discharged ink. That is, the head drive circuit 101 stabilizes the discharge rate by controlling the pulse width of the precursor. The relationship between the pulse width of the precursor and the discharge rate will be described later.

Next, the pulse applied to the actuator 16 of each channel of the channel group 102 by the head drive circuit 101 will be described.

Figure 11:
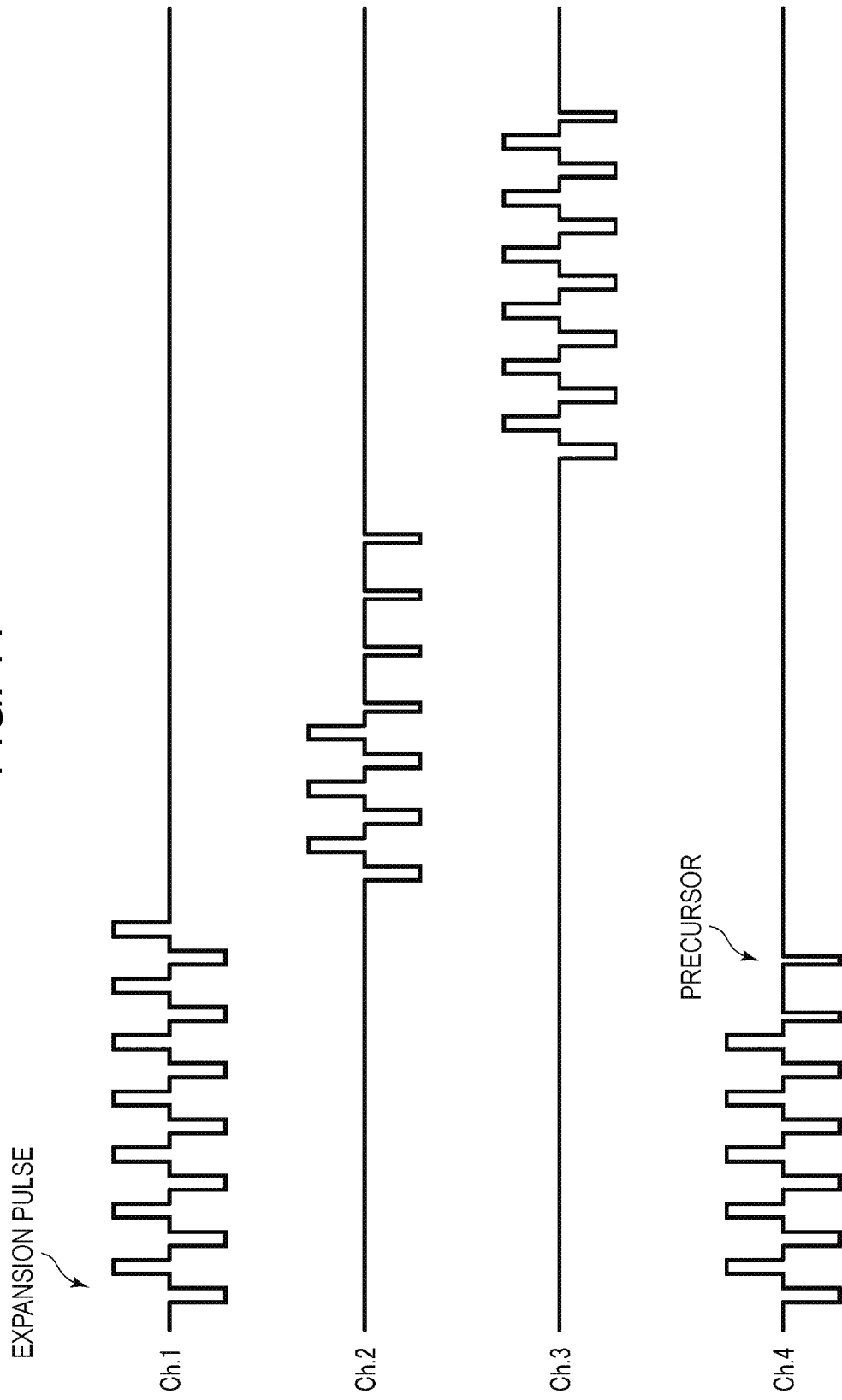
FIG. 11 is a timing chart illustrating an example of pulses applied to the actuator.

FIG. 11 is a timing chart illustrating pulses applied to the actuator 16 of each channel of the channel group 102 by the head drive circuit 101. In FIG. 11, the graphs of Ch. 1, Ch. 2, Ch. 3, and Ch. 4 show pulses applied to the actuators 16 forming the respective pressure chambers 15 of Ch. 1, Ch. 2, Ch. 3, and Ch. 4.

Here, the head drive circuit 101 discharges up to seven (which is, e.g., the maximum drop number) ink droplets from the pressure chamber 15 to form one dot during a dot formation cycle. In addition, the head drive circuit 101 performs three-division driving. That is, the head drive circuit 101 applies pulses to the actuator 16 of each channel in the order of Ch. 3n−2, Ch. 3n−1, and Ch. 3n.

As illustrated in FIG. 11, first, the head drive circuit 101 applies pulses to Ch. 1, Ch. 4, . . . (Ch. 3n−2) during a dot formation cycle. In the example illustrated in FIG. 11, the head drive circuit 101 applies the discharge pulse of the maximum drop number to the actuator 16 of Ch. 1. That is, the head drive circuit 101 applies seven discharge pulses successively.

In addition, at the same time, the head drive circuit 101 applies discharge pulse(s) of a first number smaller than the maximum drop number to the actuator 16 of Ch. 4. In addition, the head drive circuit 101 applies the precursor(s) during the remaining period. That is, the head drive circuit 101 applies precursor(s) of a second number equal to the difference between the maximum drop number and the number of discharge pulse(s). Here, the head drive circuit 101 applies first the discharge pulse(s) and then the precursor(s). That is, the head drive circuit 101 applies precursor(s) after applying the discharge pulse(s). In addition, the head drive circuit 101 applies one precursor at the timing when one discharge pulse is applied to the actuators 16 of another channel. Here, the head drive circuit 101 applies a precursor to the actuator 16 of another channel during a period in which the expansion pulse of a discharge pulse is applied.

In the example illustrated in FIG. 11, the head drive circuit 101 successively applies five discharge pulses to the actuator 16 of Ch. 4. After applying the five discharge pulses, the head drive circuit 101 successively applies two precursors. The head drive circuit 101 applies a precursor to the actuator 16 of Ch. 4 at the timing when the expansion pulse of a discharge pulse is applied to the actuator 16 of Ch. 1.

The head drive circuit 101 applies pulses to the actuators 16 of Ch. 2 and Ch. 5 (Ch. 3n−1) during the next dot formation cycle, after the application of the pulses to the actuators 16 of Ch. 1, Ch. 4, . . . (Ch. 3n−2) is completed.

In the example illustrated in FIG. 11, the head drive circuit 101 successively applies three discharge pulses to the actuator 16 of Ch. 2. The head drive circuit 101 applies four precursors successively after applying the three discharge pulses.

The head drive circuit 101 applies pulses to the actuators 16 of Ch. 3 and Ch. 6 (Ch. 3n) during the next dot formation cycle, after the application of the pulses to the actuators 16 of Ch. 2 and Ch. 5 (Ch. 3n−1) is completed.

In the example illustrated in FIG. 11, the head drive circuit 101 successively applies six discharge pulses to the actuator 16 of Ch. 3. The head drive circuit 101 successively applies one precursor after applying six discharge pulse.

The head drive circuit 101 applies pulses to the actuators 16 of Ch. 1 and Ch. 4 (Ch. 3n−2) again during the next dot formation cycle after applying the pulses to the actuators 16 of Ch. 3, Ch. 6, . . . (Ch. 3n). The head drive circuit 101 forms an image on a medium such as paper by repeating the same operation for each dot formation cycle.

Figure 12:
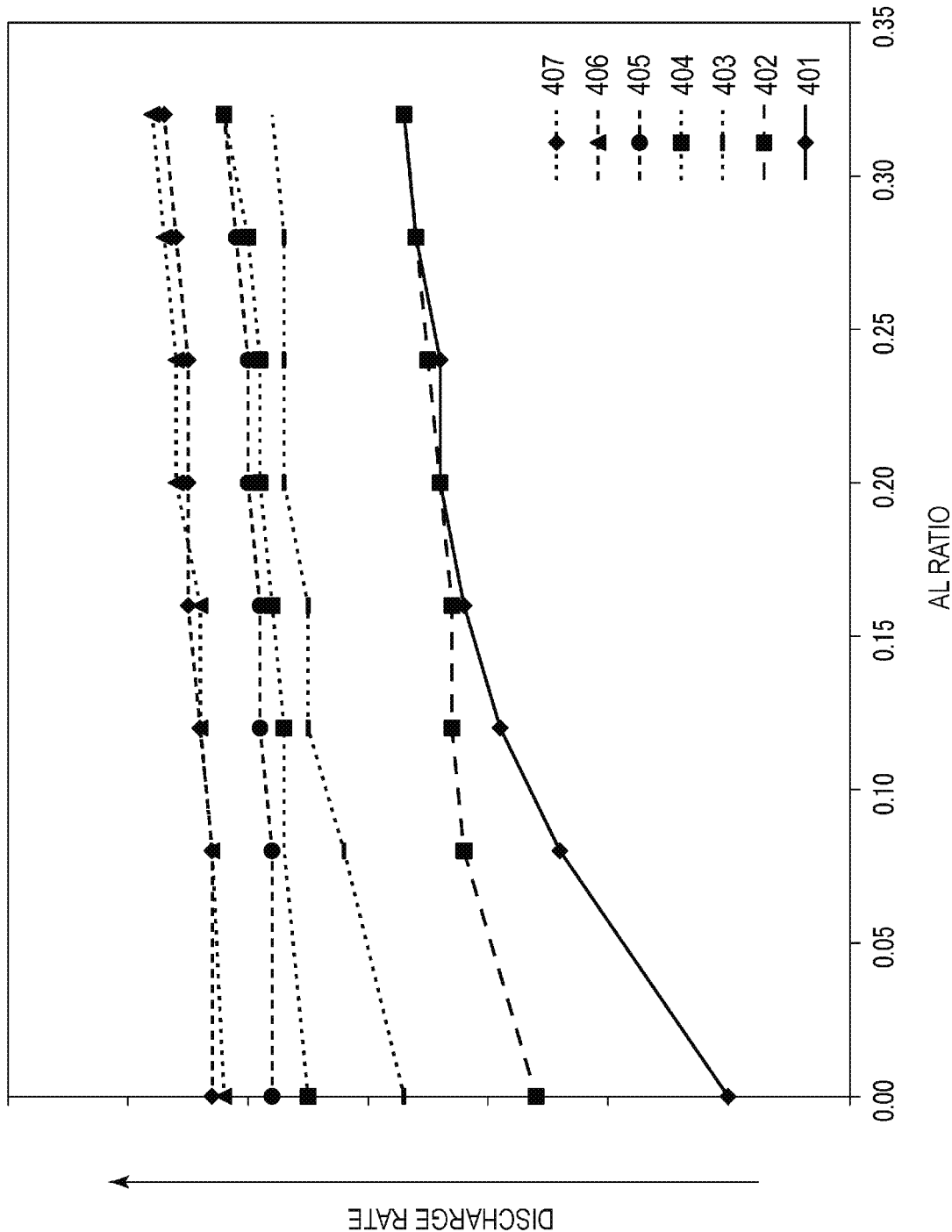
FIG. 12 is a graph showing a discharge rate of ink droplets discharged from the ink jet head in relation to a pulse width of a precursor.

Next, a relationship between the pulse width of the precursor and the discharge rate of the ink droplet will be described. FIG. 12 is a graph showing the relationship between the pulse width of the precursor and the discharge rate of the ink droplet.

FIG. 12 shows the ink discharge rate when a dot is formed by one to seven ink droplets. The X axis indicates the pulse width of the precursor in AL unit. In addition, the Y axis indicates the discharge rate. In FIG. 12, the discharge rate is a discharge rate of the last ink droplet among one or more discharged ink droplets.

Graphs 401 to 407 show the discharge rates of ink droplets when one to seven ink droplets are discharged, respectively. For example, the graph 401 shows the discharge rate when the head drive circuit 101 applies one discharge pulse and applies six precursors.

As shown by the graphs 401 to 407, when the pulse width of the precursor is increased, the variation in the discharge rate is suppressed.

As shown by the graph 401, the discharge rate when one ink droplet is discharged increases as the pulse width of the precursor increases. The graph 401 comes into contact with the graph 402 at a precursor pulse width of 0.2 AL. Further, in a range in which the pulse width of the precursor is 0.2 AL or more, the graph 401 and the graph 402 substantially overlap with each other. That is, when the pulse width of the precursor is 0.2 AL or more (0.1 times or more of the natural vibration period), the discharge rate when one ink droplet is discharged coincides with the discharge rate when two ink droplets are discharged.

The maximum drop number may be 6 or less or 8 or more. The maximum drop number is not limited to a specific value as long as the number is 2 or more. When the maximum drop number is 1, there are two types: discharge pulse or precursor, and the discharge pulse or precursor is not inserted after discharge.

In addition, the precursor may be a contraction pulse. For example, the precursor may include a contraction pulse of a shorter than the contraction pulse of the discharge pulse. The head drive circuit 101 may apply the precursor during a period in which the contraction pulse of the discharge pulse is applied to the actuator 16 of another channel.

Further, the head drive circuit 101 may apply precursors of a number smaller than the difference between the maximum drop number and the number of discharge pulses. For example, when the maximum drop number is 7, the head drive circuit 101 may apply four discharge pulses and two or less precursors to form one dot.

In addition, the head drive circuit 101 may apply precursor(s) before applying discharge pulse(s). For example, the head drive circuit 101 prints four discharge pulses after successively applying three precursors.

Alternatively, the head drive circuit 101 may alternately apply the discharge pulses and the precursors.

In the ink jet head configured as described above, when the number of discharge pulses less than the maximum drop number are applied to the actuator, the precursor is applied to the actuator during the remaining period in which the discharge pulse is not applied. As a result, the ink jet head can suppress the variation in the discharge rate for each number of discharge pulses.

In the ink jet head, when the pulse width of the precursor is 0.2 AL, the discharge rate when one discharge pulse is applied coincides with the discharge rate when two discharge pulses are applied. As a result, the ink jet head can suppress a difference between the discharge rate when one ink droplet forms a dot and the discharge rate when two ink droplets form a dot.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid discharge head comprising:
   an array of actuators including first and second actuators, each actuator of the array being configured to expand and contract a pressure chamber corresponding thereto; and
   a drive circuit configured to, during a dot formation cycle:
      apply a first number of discharge pulses to the first actuator to cause the first number of droplets to be discharged from a first pressure chamber corresponding to the first actuator, the first number being greater than or equal to two; and
      apply a second number of discharge pulses to the second actuator to cause the second number of droplets to be discharged from a second pressure chamber corresponding to the second actuator and apply a third number of precursors to the second actuator, each of the second and third numbers being greater than or equal to one, and a sum of the second and third numbers being less than or equal to the first number.

2. The liquid discharge head according to claim 1, wherein
   each of the first number of discharge pulses includes an expansion pulse having a first pulse width to cause expansion of the first pressure chamber from a neutral state, and
   each of the third number of precursors includes an expansion pulse having a second pulse width to cause expansion of the second pressure chamber from a neutral state, the second pulse width being less than the first pulse width.

3. The liquid discharge head according to claim 1, wherein each of the third number of precursors includes an expansion pulse to cause expansion of the second pressure chamber from a neutral state, and includes no contraction pulse to cause contraction of the second pressure chamber from the neutral state.

4. The liquid discharge head according to claim 1, wherein each of the third number of precursors includes a contraction pulse to cause contraction of the second pressure chamber from a neutral state and includes no expansion pulse to cause expansion of the second pressure chamber from the neutral state.

5. The liquid discharge head according to claim 1, wherein the drive circuit applies at least one of the third number of precursors to the second actuator in synchronization with one of the first number of discharge pulses to the first actuator.

6. The liquid discharge head according to claim 5, wherein
   each of the first number of discharge pulses applied to the first actuator includes an expansion pulse to cause expansion of the first pressure chamber from a neutral state, and the drive circuit applies the at least one of the third number of precursors to the second actuator in synchronization with one of the expansion pulses included in the first number of discharge pulses to the first actuator.

7. The liquid discharge head according to claim 1, wherein each of the third number of precursors has a pulse width greater than 0.1 times a natural vibration period of a pressure chamber formed by the array of actuators.

8. The liquid discharge head according to claim 1, wherein the drive circuit applies the third number of the precursors to the second actuator after applying all of the second number of discharge pulses to the second actuator.

9. The liquid discharge head according to claim 1, wherein the drive circuit applies the second number of discharge pulses to the second actuator after applying all of the third number of precursors to the second actuator.

10. The liquid discharge head according to claim 1, wherein the drive circuit at least partially applies alternately the second number of discharge pulses and the third number of precursors to the second actuator.

11. A printer comprising:
a medium conveyer;
a liquid discharge head configured to discharge droplets of liquid to a medium conveyed by the medium conveyer, the liquid discharge head including an array of actuators including first and second actuators, each actuator of the array being configured to expand and contract a pressure chamber corresponding thereto; and
a drive circuit configured to, during a dot formation cycle:
apply a first number of discharge pulses to the first actuator to cause the first number of droplets to be discharged from a first pressure chamber corresponding to the first actuator, the first number being greater than or equal two; and
apply a second number of discharge pulses to the second actuator to cause the second number of droplets to be discharged from a second pressure chamber corresponding to the second actuator and apply a third number of precursors to the second actuator, each of the second and third numbers being greater than or equal to one, and a sum of the second and third numbers being less than or equal to the first number.

12. The printer according to claim 11, wherein
each of the first number of discharge pulses includes an expansion pulse having a first pulse width to cause expansion of the first pressure chamber from a neutral state, and
each of the third number of precursors includes an expansion pulse having a second pulse width to cause expansion of the second pressure chamber from a neutral state, the second pulse width being less than the first pulse width.

13. The printer according to claim 11, wherein each of the third number of precursors includes an expansion pulse to cause expansion of the second pressure chamber from a neutral state, and includes no contraction pulse to cause contraction of the second pressure chamber from the neutral state.

14. The printer according to claim 11, wherein each of the third number of precursors includes a contraction pulse to cause contraction of the second pressure chamber from a neutral state and includes no expansion pulse to cause expansion of the second pressure chamber from the neutral state.

15. The printer according to claim 11, wherein the drive circuit applies at least one of the third number of precursors to the second actuator in synchronization with one of the first number of discharge pulses to the first actuator.

16. The printer according to claim 15, wherein
each of the first number of discharge pulses applied to the first actuator includes an expansion pulse to cause expansion of the first pressure chamber from a neutral state, and
the drive circuit applies the at least one of the third number of precursors to the second actuator in synchronization with one of the expansion pulses included in the first number of discharge pulses to the first actuator.

17. The printer according to claim 11, wherein each of the third number of precursors has a pulse width greater than 0.1 times a natural vibration period of a pressure chamber formed by the array of actuators.

18. The printer according to claim 11, wherein the drive circuit applies the third number of the precursors to the second actuator after applying all of the second number of discharge pulses to the second actuator.

19. The printer according to claim 11, wherein the drive circuit applies the second number of discharge pulses to the second actuator after applying all of the third number of precursors to the second actuator.

20. The printer according to claim 11, wherein the drive circuit at least partially applies alternately the second number of discharge pulses and the third number of precursors to the second actuator.

* * * * *